US012641989B2

(12) United States Patent
Jeon et al.

(10) Patent No.: US 12,641,989 B2
(45) Date of Patent: May 26, 2026

(54) DISPLAY APPARATUS

(71) Applicant: LG DISPLAY CO., LTD., Seoul (KR)

(72) Inventors: Min-Woo Jeon, Paju-si (KR);
Seong-Hyeon Lee, Paju-si (KR);
Jong-Gun Lee, Paju-si (KR);
Jung-Min Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 153 days.

(21) Appl. No.: 18/090,933

(22) Filed: Dec. 29, 2022

(65) Prior Publication Data

US 2023/0217702 A1    Jul. 6, 2023

(30) Foreign Application Priority Data

Dec. 30, 2021    (KR) ........................ 10-2021-0192637

(51) Int. Cl.
*H10K 59/80*      (2023.01)
*G02F 1/1333*     (2006.01)
*G02F 1/1335*     (2006.01)
*G02F 1/13363*    (2006.01)
*H10K 59/12*      (2023.01)

(52) U.S. Cl.
CPC ...  *H10K 59/8792* (2023.02); *G02F 1/133305*
(2013.01); *G02F 1/133331* (2021.01); *G02F 1/133512* (2013.01); *G02F 1/133528*
(2013.01); *G02F 1/13363* (2013.01); *G02F 2202/28* (2013.01); *H10K 59/12* (2023.02)

(58) Field of Classification Search
CPC ...... H10K 50/865; H10K 50/86; H10K 59/50;

G02F 1/133331; G02F 1/13363; G02F 1/133528; G02F 1/136209; G02F 1/133512; G02F 2202/28; B32B 17/10504; H01L 27/3272
See application file for complete search history.

(56) References Cited

U.S. PATENT DOCUMENTS

| | | | | |
|---|---|---|---|---|
| 2017/0187004 A1* | 6/2017 | Giraldo | ............... | H10K 50/844 |
| 2020/0091458 A1* | 3/2020 | Oh | ............................. | C09J 7/38 |
| 2021/0111373 A1* | 4/2021 | Park | ..................... | H10K 59/879 |
| 2024/0069264 A1* | 2/2024 | Yoshinari | .............. | H05B 33/02 |

FOREIGN PATENT DOCUMENTS

| | | | | |
|---|---|---|---|---|
| CN | 105492936 A | | 4/2016 | |
| KR | 10-1459128 B1 | | 11/2014 | |
| KR | 10-2015-0104282 A | | 9/2015 | |
| KR | 10-2016-0142535 A | | 12/2016 | |
| KR | 10-2018-0136038 A | | 12/2018 | |
| KR | 10-2020-0019025 A | | 2/2020 | |
| KR | 20200019025 A | * | 2/2020 | |
| KR | 10-2020-0026370 A | | 3/2020 | |
| WO | WO-2020100468 A1 | * | 5/2020 | ............. B32B 7/023 |

\* cited by examiner

*Primary Examiner* — Jia X Pan

(74) *Attorney, Agent, or Firm* — Birch, Stewart, Kolasch & Birch, LLP

(57)    ABSTRACT

A display apparatus can include a display panel configured to display an image, a polarizing plate disposed on the display panel, a first film disposed on the polarizing plate, a liquid crystal layer disposed on the first film, and a second film disposed on the liquid crystal layer. Also, the liquid crystal layer can be disposed in a cover member and have a retardation of a quarter wave ($\lambda/4$) to a half wave ($\lambda/2$), and the liquid crystal layer can be spaced apart from the flexible display panel.

14 Claims, 7 Drawing Sheets

| optical axis of liquid crystal layer | Embodiment A | | | Embodiment B | | |
|---|---|---|---|---|---|---|
| | a | b | c | d | e | f |
| 0 | ● | ● | ● | ● | ● | ● |
| 25 | · | ● | ● | · | ● | ● |
| 45 | · | ● | ● | · | ● | ● |
| 65 | · | ● | ● | · | ● | ● |
| 90 | · | ● | ● | · | ● | ● |

DISPLAY APPARATUS

CROSS-REFERENCE TO RELATED APPLICATIONS

The present application claims priority to Korean Patent Application No. 10-2021-0192637 filed in Republic of Korea on Dec. 30, 2021, the entire contents of which are hereby expressly incorporated by reference into the present application.

BACKGROUND

Field of the Invention

The present disclosure relates to a display apparatus capable of preventing a stain type of defect or mura defect.

Discussion of the Related Art

Recently, with further developments in multimedia, an importance of a flat display apparatus has been increased. In response to this, display apparatuses, such as a liquid crystal display apparatus and an organic light emitting diode display apparatus, have been commercialized. Among these display apparatuses, the organic emitting diode display apparatus is currently being widely used and offers advantages, such as high response speed, high luminance and good viewing angle.

In addition, in recent years, various flexible display apparatuses have been developed. For example, rollable, foldable, and stretchable display apparatuses have been developed. However, in such a flexible display apparatus, a cover member (or cover window) made of a plastic material is disposed on a display panel, and since the cover member has different transmittance for each wavelength, a defect such as a rainbow mura is caused by a bias of a transmitted color. For example, when a flexible display apparatus is bent or manipulated, color transmittance may vary or be changed for certain colors, and image defects such as spotting or mura may become readily apparent to a viewer, which can impair image quality.

SUMMARY OF THE DISCLOSURE

Accordingly, the present disclosure is directed to a display apparatus that substantially obviates or addresses one or more of the limitations and disadvantages associated with the related art.

An advantage of the present disclosure is to provide a display apparatus which includes a liquid crystal layer disposed below a second film, thus equalizes a transmittance in an entire wavelength band and prevents light leakage, and thus can prevent a stain or image defect, such as a rainbow mura.

Additional features and advantages of the disclosure will be set forth in the description which follows, and in part will be apparent from the description, or can be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a display apparatus includes: a display panel displaying an image; a polarizing plate disposed on the display panel; a first film disposed on the polarizing plate; a liquid crystal layer disposed on the first film; and a second film disposed on the liquid crystal layer.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE EMBODIMENTS

Figure 1:
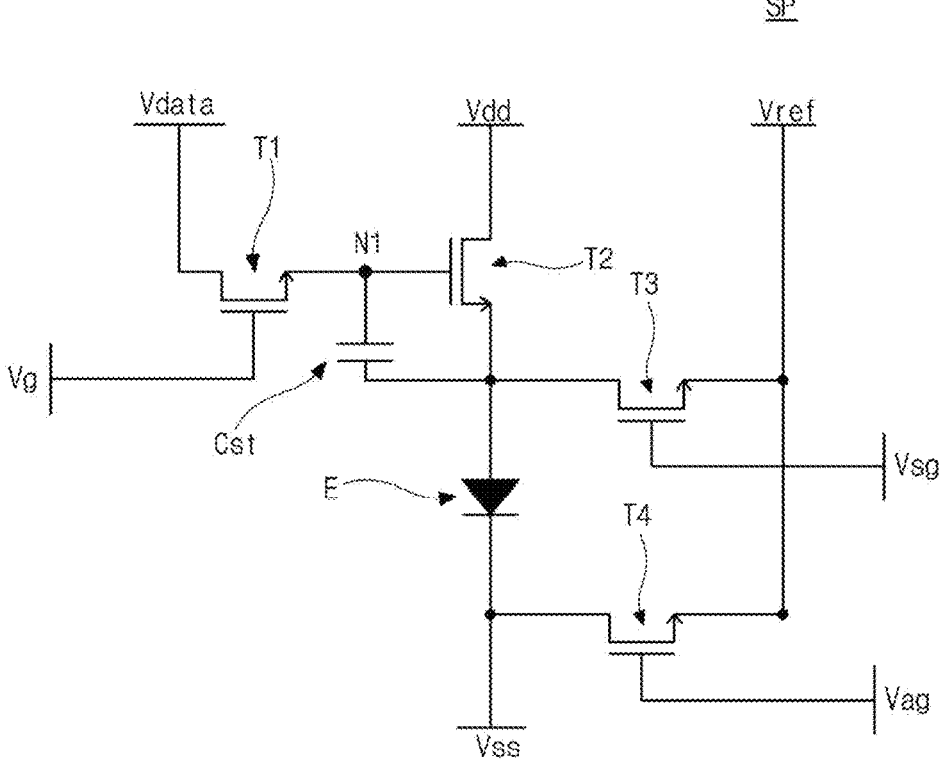
FIG. 1 is a circuit diagram of an organic light emitting diode display apparatus according to an embodiment of the present disclosure.

Advantages and features of the present disclosure and methods of achieving them will be apparent with reference to the embodiments described below in detail with the accompanying drawings. However, the present disclosure is not limited to the embodiments disclosed below, but can be realized in a variety of different forms, and only these embodiments allow the present disclosure to be complete. The present disclosure is provided to fully inform the scope of the disclosure to the skilled in the art of the present invention, and the present invention is only defined by the scope of the claims.

The shapes, sizes, proportions, angles, numbers, and the like disclosed in the drawings for explaining the embodiments of the present disclosure are illustrative, and the present disclosure is not limited to the illustrated matters. The same reference numerals refer to the same components throughout the description.

Furthermore, in describing the present disclosure, if it is determined that a detailed description of the related known technology unnecessarily obscure the subject matter of the present disclosure, the detailed description thereof can be omitted. When 'comprising', 'including', 'having', 'consisting', and the like are used in this disclosure, other parts can be added unless 'only' is used. When a component is expressed in the singular, situations including the plural are included unless specific statement is described.

In interpreting the components, even if there is no separate explicit description, it is interpreted as including a margin range.

In the situation of a description of a positional relationship, for example, when the positional relationship of two parts is described as "on," "over," "above," "below," "beside," "under," and the like, one or more other parts can be positioned between such two parts unless 'right' or 'directly' is used.

In the situation of a description of a temporal relationship, for example, when a temporal precedence is described as "after," "following," "before," and the like, situations that are not continuous can be included unless "directly" or "immediately" is used.

Respective features of various embodiments of the present disclosure can be partially or wholly connected to or combined with each other and can be technically interlocked and driven variously, and respective embodiments can be independently implemented from each other or can be implemented together with a related relationship.

In describing components of the present disclosure, terms such as first, second, A, B, (a), (b) and the like can be used. These terms are only for distinguishing the components from other components, and an essence, order, order, or number of the components is not limited by the terms. Further, when it is described that a component is "connected," "coupled" or "contact" to another component, the component can be directly connected or contact the another component, but it should be understood that other component can be "interposed" between the components.

"At least one" should be understood to include all combinations of one or more of associated components. For example, meaning of "at least one of first, second, and third components" means not only the first, second, or third component, but also all combinations of two or more of the first, second and third components.

In this disclosure, an "apparatus" can include a display apparatus, such as a liquid crystal module (LCM), an organic light emitting display module (OLED module) or the like, including a display panel and a driving portion for driving the display panel. Furthermore, the "apparatus" can include a complete product or final product which is a notebook computer, a television, a computer monitor, an automotive device or equipment display including other type of vehicle, or a set electronic device or set device or set apparatus such as a mobile electronic device which is a smart phone, an electronic pad or the like, including the LCM, OLED module or the like.

Therefore, the apparatus of this disclosure can include a display apparatus itself, such as the LCM, OLED or the like, and/or an application product or a set device that is an end-user device, including the LCM, OLED module or the like.

Further, in some embodiments, the LCM, OLED module or the like configured with a display panel and a driving portion can be expressed as a "display apparatus," and an electronic apparatus as a final product including the LCM, OLED module or the like can be distinguished and expressed as a "set device." For example, the display apparatus can include a liquid crystal or organic light emitting diode (OLED) display panel, and a source printed circuit board (PCB) that is a control portion for driving the display panel. The set device can further include a set PCB which is a set control portion electrically connected to the source PCB to drive the entire set device.

The display panel used in embodiments of the present disclosure can use all types of display panels, such as a liquid crystal display panel, an organic light emitting diode (OLED) display panel, and an electro-luminescent display panel, but the embodiments are not limited thereto. The display panel applied to the display apparatus according to embodiments of the present disclosure is not limited to a shape or size of the display panel.

Features of various embodiments of the present disclosure can be partially or wholly combined with each other, technically various interlocking and driving thereof are possible, and embodiments can be implemented independently from each other or can be implemented together in a related relationship and are combinable.

Hereinafter, embodiments of the present disclosure are described with reference to accompanying drawings. Scales of components shown in the drawings may be different from scales of actual components for convenience of description, and thus are not limited to sizes shown in the drawings.

As the display apparatus of the present disclosure, various display apparatuses, such as an organic light emitting diode display device, a liquid crystal display apparatus, an electrophoretic display apparatus, a mini-LED (Light Emitting Diode) display apparatus, and a micro LED display apparatus, can be applied. For convenience of explanations, an organic light emitting diode display apparatus is described below by way of example.

Hereinafter, the present disclosure is described in detail with reference to accompanying drawings.

FIG. 1 is a circuit diagram of an organic light emitting diode display apparatus according to a first embodiment of the present disclosure.

Referring to FIG. 1, the organic light emitting diode display apparatus according to the present disclosure can include a display area and a pad area. The display area can include a plurality of sub-pixels SP. Each sub-pixel SP can display a single color in the organic light emitting diode display apparatus. For example, each sub-pixel SP can display any one of red, green, blue, and white. In this situation, the red, green, blue, and white sub-pixels SP can be defined to form one pixel. The plurality of sub-pixels SP can be arranged in a matrix on the substrate of the organic light emitting diode display apparatus, and a plurality of lines can be disposed between the plurality of sub-pixels SP in the display area.

In addition, various lines electrically connected to the lines disposed in the display area and for applying signals to the light emitting element E of the organic light emitting diode display apparatus can be disposed in the pad area. The lines in the pad area can include, for example, a Vdd line (e.g., high potential line), a Vdata line, a reference (Vref) line, and a Vss line (e.g., low potential line), but are not limited thereto.

Each sub-pixel SP of the organic light emitting diode display apparatus can include a switching thin film transistor T1, a driving thin film transistor T2, a storage capacitor Cst, a sensing thin film transistor T3, an auxiliary thin film transistor T4, and the light emitting element E. Since the sub-pixel SP of the organic light emitting diode display apparatus according to the present disclosure includes four thin film transistors and one capacitor, it can be referred to as a 4T1C structure. However, the structure of the sub-pixel SP of the organic light emitting diode display apparatus according to the present disclosure is not limited thereto, and can be configured in various compensation structures such as a 4T2C structure including four thin film transistors and two capacitors, a 5T2C structure including five thin film transistors and two capacitors, a 6T2C structure including six thin film transistors and two capacitors, and a 7T2C structure including seven thin film transistors and two capacitors.

Each of the four thin film transistors included in the sub-pixel SP can include a semiconductor layer, a gate electrode, a source electrode, and a drain electrode, and can be a P-type thin film transistor or an N-type thin film transistor. FIG. 1 shows an N-type thin film transistor for convenience for explanations.

The switching thin film transistor T1 can include a drain electrode connected to a data line, a source electrode connected to a first node N1, and a gate electrode connected to a gate line. The switching thin film transistor T1 can be turned on based on a gate voltage Vg applied from a gate driving portion to the gate line, and can charge a data voltage Vdata, which is applied to the data line from a data driving portion, to the first node N1.

The driving thin film transistor T2 can include a drain electrode connected to a high potential line (e.g., a Vdd line), a source electrode connected to an anode of the light emitting element E, and a gate electrode connected to the first node N1. The driving thin film transistor T2 can be turned on when the voltage of the first node N1 is higher than a threshold voltage (Vth), and can be turned off when the voltage of the first node N1 is lower than the threshold voltage (Vth). The driving thin film transistor T2 can transfer a driving current received from the Vdd line to the light emitting element E.

The storage capacitor Cst can include an electrode connected to the first node N1 and an electrode connected to the source electrode of the driving thin film transistor T2. The storage capacitor Cst can maintain a potential difference between the gate electrode and the source electrode of the driving thin film transistor T2 during an emission time during which the light emitting element E emits light, thereby providing a constant driving current to the light emitting element E.

The sensing thin film transistor T3 can include a drain electrode connected to the source electrode of the driving thin film transistor T2, a source electrode connected to the reference line, and a gate electrode connected to a sensing gate line and supplied with a sensing gate voltage Vsg. The sensing thin film transistor T3 can be a thin film transistor for sensing the threshold voltage of the driving thin film transistor T2.

The auxiliary thin film transistor T4 can include a drain electrode electrically connected to a cathode of the light emitting element E, a source electrode electrically connected to the reference line, and a gate electrode electrically connected to an auxiliary gate line and supplied with an auxiliary gate voltage Vag. The auxiliary thin film transistor T4 can be turned off in the emission time, and when the auxiliary thin film transistor T4 is turned on, it can transfer the reference voltage Vref to the cathode of the light emitting element E.

Figure 2:
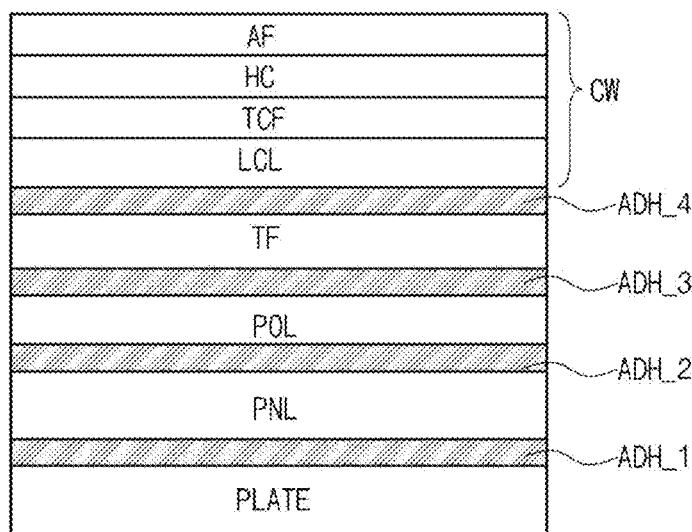
FIG. 2 is a view illustrating a display apparatus according to an embodiment of the present disclosure.

FIG. 2 is a view illustrating a display apparatus according to a first embodiment of the present disclosure.

As shown in FIG. 2, the display apparatus according to the first embodiment of the present specification can include a back plate PLATE, a display panel PNL disposed on the back plate PLATE to display an actual image, a polarizing plate POL disposed on the display panel PNL to prevent reflection of external light incident from the outside, a first film TF disposed on the polarizing plate POL, and a cover member (or cover window) CW disposed on the first film TF.

The display panel PNL can be attached to the back plate PLATE with a first adhesive ADH_1, the polarizing plate POL can be attached to the display panel PNL with a second adhesive ADH_2, the first film TF can be attached to the polarizing plate POL with a third adhesive ADH_3, and the cover member CW can be attached to the first film TF with a fourth adhesive ADH_4.

Figure 3:
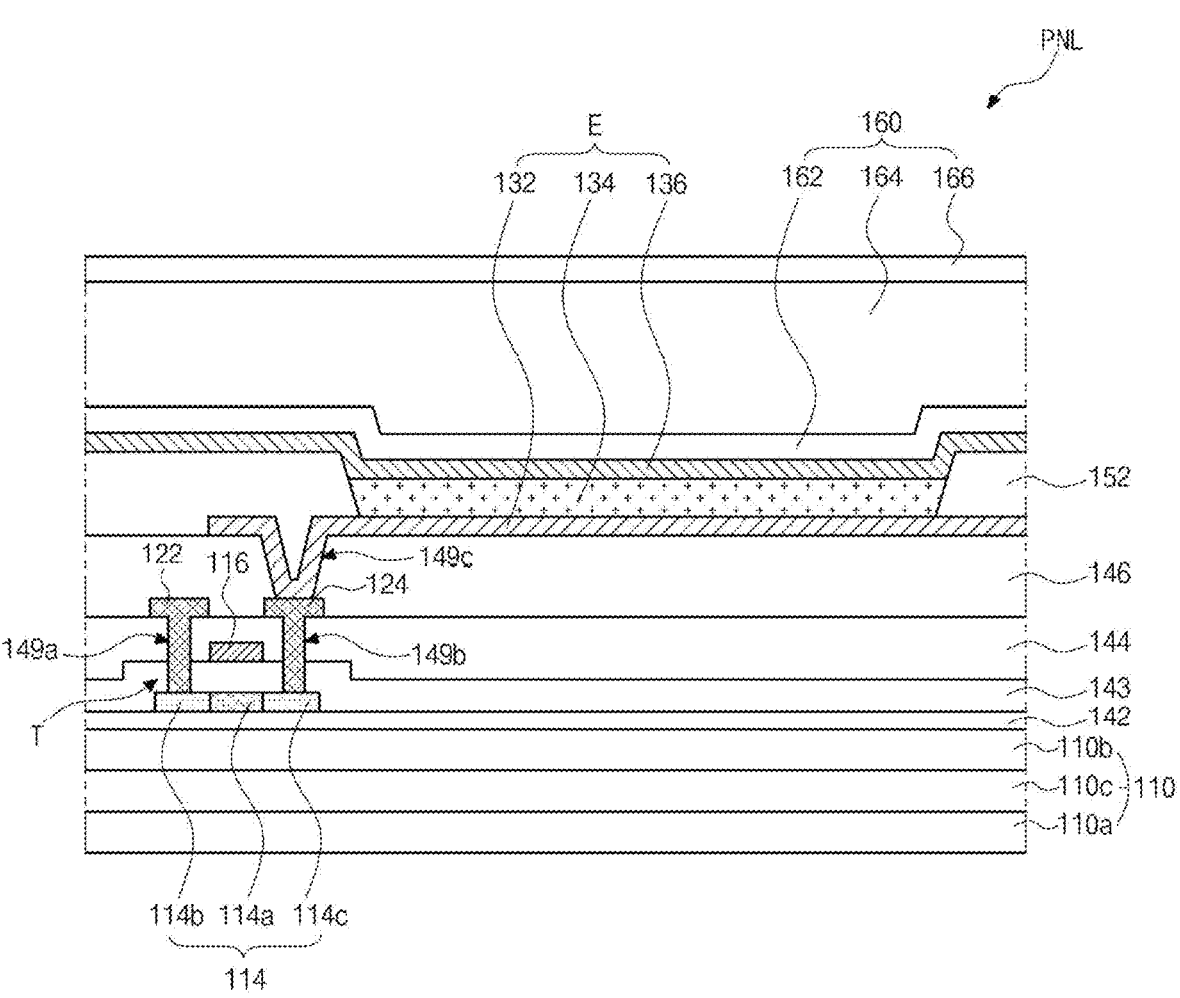
FIG. 3 is a cross-sectional view illustrating a display panel according to an embodiment of the present disclosure.

FIG. 3 is a cross-sectional view illustrating a display panel according to a first embodiment of the present disclosure. Although the display panel PNL substantially includes a plurality of sub-pixels, one sub-pixel is illustrated in FIG. 3 for convenience of explanation.

As shown in FIG. 3, a thin film transistor T can be disposed on a substrate 110. Although various thin film transistors, such as a switching thin film transistor, a driving thin film transistor, a sensing thin film transistor, and an auxiliary thin film transistor, can be disposed in each sub-pixel of the display panel PNL, one thin film transistor T is shown in FIG. 3 for convenience of explanations. Accordingly, the thin film transistor T can be any one of the switching thin film transistor, the driving thin film transistor, the sensing thin film transistor, and the auxiliary thin film transistor.

For example, since the switching thin film transistor, the driving thin film transistor, the sensing thin film transistor, and the auxiliary thin film transistor can all have the same structure, a structure of all the thin film transistors can be expressed with the thin film transistor T.

As shown in FIG. 3, the thin film transistor T can include a semiconductor layer 114 formed on a buffer layer 142 which is formed on the substrate 110, and a gate insulating layer 143 stacked on the buffer layer 142 to cover the semiconductor layer 114, a gate electrode 116 disposed on the gate insulating layer 143, an inter-layered insulating layer 144 stacked on the gate insulating layer 143 to cover the gate electrode 116, and source electrode 122 and the drain electrode 124 disposed on the inter-layered insulating layer 144.

The substrate 110 can include a first base film 110*a*, a second base film 110*b*, and an inorganic inter-layered insulating layer 110*c* disposed between the first base film 110*a* and the second base film 110*b*. The first base film 110*a* and the second base film 110*b* can be made of a foldable transparent plastic material. For example, the first base film 110*a* and the second base film 110*b* can use PI (polyimide), PET (polyethylene terephthalate), PEN (polyethylene naphthalate), PC (polycarbonate), PES (polyethersulfone), PAR (polyarylate), polysulfone (PSF), or cyclic-olefin copolymer (COC). However, the substrate 110 of the present disclosure is not limited to such types of plastic material, but can be made of a foldable thin glass.

The buffer layer 142 can protect the thin film transistor T formed in a subsequent process from impurities, such as alkali ions leaking from the substrate 110, or block moisture that can penetrate from an outside. The buffer layer 142 can be formed of a single layer of silicon oxide (SiOx) or silicon nitride (SiNx) or multi layers using silicon oxide (SiOx) and silicon nitride (SiNx).

The semiconductor layer 114 can be formed of an amorphous semiconductor such as amorphous silicon (a-Si), a crystalline semiconductor such as polycrystalline silicon (p-Si), or an oxide semiconductor such as indium gallium zinc oxide (IGZO), but is not limited thereto. The semiconductor layer 114 can include a channel region 114*a* of a central region, and a source region 114*b* and a drain region 114*c* which are doped regions at both sides of the semiconductor layer 114.

The gate electrode 116 can be formed of a single layer or a plurality of layers using a metal(s) such as Cr, Mo, Ta, Cu, Ti, Al, and/or an Al alloy, but is not limited thereto.

The inter-layered insulating layer 144 can be formed of a single layer or a plurality of layers using an organic material such as photoacrylic or an inorganic material such as SiNx or SiOx, but is not limited thereto. In addition, the inter-layered insulating layer 144 can be formed of a plurality of layers of the organic material layer and the inorganic material layer.

The source electrode 122 and the drain electrode 124 can be formed of a single layer or a plurality of layers using a metal(s) such as Cr, Mo, Ta, Cu, Ti, Al, and/or an Al alloy, but is not limited thereto.

The source electrode 122 and the drain electrode 124 can be in ohmic contact with the source region 114*b* and the drain region 114*c* of the semiconductor layer 114 through a first contact hole 149*a* and a second contact hole 149*b* formed in the gate insulating layer 143 and the inter-layered insulating layer 144, respectively.

A bottom shield metal layer can be disposed below the semiconductor layer 114 and on the substrate 110. The bottom shield metal layer can minimize a back channel phenomenon caused by charges trapped in the substrate 110 to prevent afterimages or deterioration of a transistor performance. The bottom shield metal layer can be formed of a single layer or a plurality of layers using titanium (Ti), molybdenum (Mo) and/or an alloy of Ti and Mo, but is not limited thereto.

A passivation layer 146 can be formed on the substrate 110 on which the thin film transistor T is disposed. The passivation layer 146 can be formed of an organic material such as photoacrylic, but is not limited thereto, and can include a plurality of layers including an inorganic layer and an organic layer. A third contact hole 149*c* can be formed in the passivation layer 146.

An anode 132 electrically connected to the drain electrode 124 of the thin film transistor T through the third contact hole 149*c* can be formed on the passivation layer 146. The anode 132 can be formed of a single layer or a plurality of layers using a metal(s) such as Ca, Ba, Mg, Al, Ag and/or an alloy thereof, but is not limited thereto. The anode 132 can be connected to the drain electrode 124 of the thin film transistor T.

A bank layer 152 can be formed at a boundary of each sub-pixel on the passivation layer 146. The bank layer 152 can be a type of a separation wall defining each sub-pixel. The bank layer 152 can partition the sub-pixels to prevent light of a specific color, which is output from adjacent sub-pixels, from being mixed and output.

A light emitting layer 134 can be formed on the anode 132 and on a portion of an inclined surface of the bank layer 152. The light emitting layer 134 can be red (R) light emitting layer which is formed in an R sub-pixel to emit red light, a green (G) light emitting layer which is formed in an G sub-pixel to emit green light, or a blue (B) light emitting layer which is formed in a B sub-pixel to emit blue light. Alternatively, the light emitting layer 134 can be a white (W) organic light emitting layer emitting a white light. For example, the light emitting layer 134 can be an organic light emitting layer, or an inorganic light emitting layer, such as a nano-sized material layer, a quantum dot light emitting layer, a micro LED layer, or a mini LED layer, but is not limited thereto.

The light emitting layer 134 can include not only an emitting material layer, but also an electron injection layer and a hole injection layer for respectively injecting electrons and holes into the emitting material layer, and an electron transport layer and a hole blocking layer for transporting injected electrons to the emitting material layer, and an electron blocking layer and a hole transport layer for transporting injected holes to the emitting material layer, but is not limited thereto.

A cathode 136 can be formed on the organic light emitting layer 134 and over the entire display apparatus. The cathode 136 can be made of a transparent conductive material such as indium tin oxide (ITO) or indium zinc oxide (IZO), or a thin metal through which visible light is transmitted, but is not limited thereto.

The anode 132, the light emitting layer 134, and the cathode 136 can form the light emitting element E to output light having a specific wavelength as a signal is applied.

An encapsulation layer 160 can be formed on the cathode 136. The encapsulation layer 160 can include a first encapsulation layer 162 made of an inorganic material, a second encapsulation layer 164 made of an organic material, and a third encapsulation layer 166 made of an inorganic material. For example, the inorganic material can include, but is not limited to, SiNx and SiOx. In addition, the organic material can include, but is not limited to, polyethylene terephthalate (PET), polyethylene naphthalate (PEN), polycarbonate (PC), polyimide (PI), polyethylene sulfonate, polyoxymethylene, polyarylate, or a mixture thereof.

Referring to FIG. 2, the back plate PLATE can be attached to a bottom (or lower) surface of the display panel PNL. In the foldable display apparatus DIS, a substrate can be formed of a plastic material, and thus a plastic substrate can be disposed on a flat support substrate such as glass and then a manufacturing process proceeds, so that various components such as thin film transistors and organic light emitting elements can be formed on the plastic substrate. After the display panel PNL is manufactured, the support substrate can be separated from the display panel PNL. As such, when the support substrate is separated, a component for supporting the plastic substrate can be required, and in this situation, the back plate PLATE can be disposed on a rear surface of the substrate of the display panel PNL to support the substrate.

In addition, the back plate PLATE can be formed of a rigid material to protect the display panel PNL from external impact, and the back plate PLATE can serve as a heat dissipation member that emits heat generated when the display apparatus DIS is driven. Furthermore, the back plate PLATE can be formed of a material having excellent electrical conductivity to discharge static electricity generated in the display apparatus DIS to the outside. The back plate PLATE can be formed of at least one of copper (Cu), copper (Cu) foam, stainless steel, graphite, and polyethylene terephthalate (PET), an alloy material thereof, and/or a junction structure thereof, but is not limited thereto.

The polarizing plate POL can be disposed on the display panel PNL. The polarizing plate POL can prevent reflection of light input from the outside to improve visibility of the display apparatus. The polarizing plate POL can transmit only light in a specific polarization direction among an external light incident from the outside and absorb a remaining light, and the light transmitted through the polarizing plate POL can be reflected by the display panel PNL and then can be incident on the polarizing plate POL again. At this time, since the polarization direction of the reflected external light is changed, the light incident back to the polarizing plate POL can be absorbed by the polarizing plate POL and may not be output to the outside, so that a reflection of the external light can be prevented.

The polarizing plate POL can be a circular polarizing plate. As such, when a circular polarizing plate is used, a retardation film of a quarter wave λ/4 can be further provided between the polarizing plate POL and the display panel PNL.

The polarizing plate POL can be formed of a polymer film mainly composed of a polyvinyl alcohol (PVA)-based resin containing iodine or dichroic dye, and protective films on both surfaces thereof. In this situation, the iodine or the dichroic dye is uniaxially stretched to be aligned in one direction. Alternatively, the polarizing plate POL can use a material other than the PVA-based resin. For example, the polarizing plate POL can use an O-type polarizer in which a liquid crystal composition containing a dichroic material and a liquid crystal compound is oriented in a predetermined direction, and/or an E-type polarizing material in which a lyotropic liquid crystal is aligned in a predetermined direction.

The protective film of the polarizing plate POL can be formed of a transparent film without phase retardation, and can protect the polymer film from external moisture or contamination. The protective film can use triacetyl cellulose (TAC), polyethylene terephthalate (PET), cycloolefin polymer (COP), or a combination thereof can be used, but is not limited thereto.

The first film TF can be attached to a top (or upper) surface of the polarizing plate POL. The first film TF can usually use a film such as PET, but is not limited thereto. For example, the first film TF can use TAC, COP, or a combination thereof.

The first film TF can have a front retardation (Ro) of 5000 nm to 10000 nm at a wavelength of 550 nm.

The cover member CW can be disposed on the first film TF to protect the display panel PNL from external impact or foreign substance such as moisture. The cover member CW can include a liquid crystal layer LCL formed on the first film TF, a second film (or cover film) TCF disposed on the liquid crystal layer LCL, a coating layer HC disposed on the second film TCF and a functional layer AF disposed on the coating layer HC.

The liquid crystal layer LCL can be formed by forming an alignment layer on the second film TCF, coating a liquid crystal on the alignment layer, and curing the coated liquid crystal. In addition, the liquid crystal layer LCL can be formed by forming an alignment layer on a separate base film, and coating and curing a liquid crystal. In this situation, the cured liquid crystal layer can be bonded to the second film TCF by an adhesive member after the base film is removed.

The liquid crystal layer LCL can have a retardation of a quarter wave λ/4 to a half wave λ/2 and can be formed to a thickness of 4 μm or less (e.g., 2 μm), but is not limited thereto.

The second film TCF can be formed of a high hardness material. For example, the second film TCF can be formed of a material having a modulus of 100 MPa or more and less than 10 GPa, and a Poisson's Ratio of 0.37 to 0.43. When the modulus of the second film TCF is 10 GPa or more, a strain of an upper portion of the liquid crystal layer LCL is strong, and cracks may occur in the liquid crystal layer LCL. In addition, when the modulus is 10 GPa or more, a folding characteristic of the display apparatus is deteriorated or impaired. In addition, since the modulus of the second film TCF is less than 100 MPa, a surface strength is weak, and thus the display panel may not be adequately protected from external impact.

The second film TCF can use a transparent polyimide film having no color, such as color polyimide (CPI), but is not limited thereto. For example, the second film TCF can be formed of a material having a modulus of 100 MPa or more and less than 10 GPa and a Poisson's ratio of 0.37 to 0.43. For example, the second film TCF can use PET, PEN, and/or acryl, but is not limited thereto. The second film TCF can be formed to a thickness of 50 μm to 120 μm (e.g., 85 μm). When the thickness of the second film TCF is less than 50 μm, a surface strength is weak, and when it exceeds 120 μm, a folding characteristic is deteriorated or impaired. In addition, a front retardation (Ro) of the second film TCF can be set to 5000 nm to 10000 nm (e.g., 7500 nm) at a wavelength of 550 nm.

When an optical axis (phi) of the first film TF is 0 degrees or 45 degrees, an optical axis (phi) of the liquid crystal layer LCL can be 15 degrees to 30 degrees, 60 degrees to 75 degrees, 105 degrees to 120 degrees, 150 degrees to 165 degrees, 185 degrees to 200 degrees, 230 degrees to 245 degrees, 285 degrees to 300 degrees, and 330 degrees to 345 degrees. The optical axis of the liquid crystal layer LCL can be an arrangement direction of liquid crystal molecules of the liquid crystal layer LCL. The coating layer HC can be formed on the second film TCF.

The coating layer HC can be laminated on the second film TCF to protect the display apparatus DIS from scratches. The coating layer HC can be formed by laminating an organic material such as a urethane acrylic resin, a methacrylic resin, and/or a silsesquioxane compound, but is not limited thereto.

The functional layer AF can be formed by being laminated on the coating layer HC or can be formed by surface-treating a top surface of the coating layer HC. The functional layer AF can include at least one of an anti-fingerprint layer, an anti-contamination layer, and an anti-glare layer, but is not limited thereto.

The anti-fingerprint layer can be formed using a method of increasing wetness of the coating layer HC so that even if a fingerprint component is attached, the wetness is spread and not conspicuous. The anti-fingerprint layer can be formed by laminating an organic material having water repellency and oil repellency. For example, the anti-fingerprint layer can be formed of a fluorine-based polymer or the like, but is not limited thereto.

The anti-contamination layer can be formed by laminating a material having good water repellency, but is not limited thereto. For example, the anti-contamination layer can be formed of a material such as a hydrocarbon-based compound, a silicone-based compound, a chlorine compound, and/or a fluorine-based compound, but is not limited thereto.

The anti-glare layer can be formed by coating a thin layer of SiOx on the coating layer HC by a spray method, or by single or double surface treatment of the coating layer HC, to generate a scattering effect, but is not limited thereto.

As described above, in the display apparatus according to the first embodiment of the present specification, the liquid crystal layer LCL is disposed between the first film TF and the second film TCF, so that a stain type of image defect, such as a rainbow mura, can be prevented. This is described below.

When the first film TF made of a material such as PET and the second film TCF made of CPI are disposed on the polarizing plate POL as in this disclosure, due to a birefringence characteristic of PET and CPI, a transmittance varies and changes depending on a wavelength of a light passing through the first film TF and the second film TCF, thereby causing a stain such as a rainbow mura for certain colors.

Figures 4, 5:
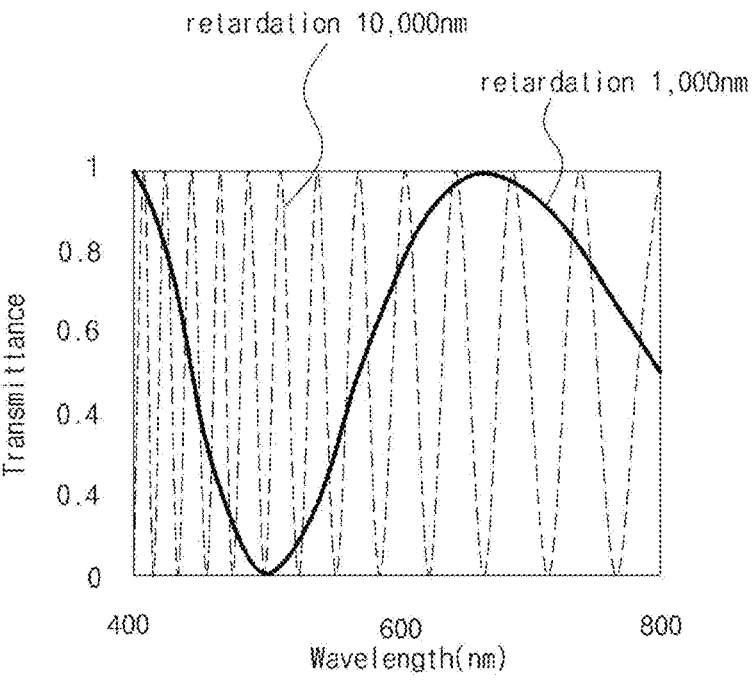
FIG. 4 is a view illustrating transmittance to wavelength of a display apparatus without a liquid crystal layer and a display device with a liquid crystal layer according to an embodiment of the present disclosure.
FIG. 5 is a view illustrating luminance deviations of a situation in which a liquid crystal layer is provided according to an embodiment of the present disclosure and a situation in which a liquid crystal layer is not provided.

FIG. 4 is a view illustrating transmittance to wavelength of a display apparatus without a liquid crystal layer and a display device with a liquid crystal layer according to a first embodiment of the present disclosure. A solid line represents a transmittance of the display apparatus without a liquid crystal layer, and a dotted line represents a transmittance of the display apparatus with the liquid crystal layer LCL.

As shown in FIG. 4, in the display apparatus without the liquid crystal layer LCL, a transmittance is 1 at a wavelength of 400 nm, whereas a transmittance decreases to 0 at a wavelength of 500 nm. In addition, a transmittance increases to 1 at a wavelength of about 670 nm and decreases again to 0.5 at a wavelength band of 800 nm. For example, in the display apparatus without the liquid crystal layer LCL, a transmittance varies greatly depending on a wavelength, so that a defect such as a rainbow mura (or rainbow stain) occur when displaying an actual image. For example, in the display apparatus without the liquid crystal layer LCL, blue and red color light may pass through more easily than green color light.

In the display apparatus provided with the liquid crystal layer LCL, since a retardation of the liquid crystal layer LCL is 5000 nm to 10000 nm, even though the first film TF and the second film TCF have birefringence, due to a high retardation, a birefringence is broken due to the high retardation, so that a uniform transmittance is obtained over the entire wavelength band as shown in FIG. 4.

In addition, since the optical axes of the liquid crystal layer LCL and the first film TF are adjusted, a light passing through the first film TF is completely absorbed in the liquid crystal layer LCL, so that an occurrence of a mura (or stain) due to light leakage can be prevented.

FIG. 5 is a view illustrating luminance deviations of a situation in which a liquid crystal layer is provided and a situation in which a liquid crystal layer is not provided.

Embodiments A and B are luminance deviations when retardations of the first films TF is 5000 nm and 10000 nm, respectively, and when optical axes of the first films TF are 0 degrees or 45 degrees. Sub-embodiments a and d are situations in which there is no liquid crystal layer, sub-embodiments b and e are situations in which an optical axis of the liquid crystal is $\lambda/4$, and sub-embodiments c and f are situations in which an optical axis of the liquid crystal is $\lambda/2$. In addition, the optical axis of the liquid crystal layer LCL is 0 degrees to 90 degrees. When the optical axis of the liquid crystal layer LCL is 90 degrees to 180 degrees, 180 degrees to 270 degrees, or 270 degrees to 360 degrees, a luminance deviation is almost similar to 0 degrees to 90 degrees, so that for convenience of explanations, the situation in which the optical axis of the liquid crystal layer LCL is 0 degrees to 90 degrees is shown.

The optical axes of the liquid crystal layer LCL shown in FIG. 4, 0 degrees, 25 degrees, 45 degrees, 65 degrees and 90 degrees are respective one examples of angular ranges of −15 (350) degrees to 15 degrees, 15 degrees to 30 degrees, 30 degrees to 60 degrees, 60 degrees to 75 degrees, and 75 degrees to 105 degrees, and the angular range including each one example has a generally similar luminance deviation.

As shown in FIG. 5, in the situations of embodiments A-a and B-d, the luminance deviation according to positions is severe, so that a stain is severe overall and rather noticeable. This means that a stain such as a mura image defect occurs on a screen.

In the embodiment A-b, when the optical axis of the liquid crystal layer LCL is 0 degrees, 45 degrees or 90 degrees, a luminance deviation similar to that of the situation in which the liquid crystal layer LCL is shown. Therefore, when the optical axis is 0 degree, 45 degree, or 90 degree, a spot occurs.

On the other hand, in the embodiment A-b, when the optical axis of the liquid crystal layer (LCL) is 25 degrees or 65 degrees, a luminance deviation is reduced compared to the situations in which the optical axis is 0 degrees, 45 degrees or 90 degrees and the liquid crystal layer LCL is not provided, so that an occurrence of a stain can be minimized.

Further, in the embodiment A-c, when the optical axis of the liquid crystal layer LCL is 0 degrees, 45 degrees or 90 degrees, a luminance deviation similar to that of the situation in which the liquid crystal layer LCL is not provided is shown. Therefore, when the optical axis is 0 degree, 45 degree or 90 degree, a stain occurs.

On the other hand, in the embodiment A-c, when the optical axis of the liquid crystal layer LCL is 25 degrees and 65 degrees, a luminance deviation is further reduced compared to the situations in which the optical axis is 0 degrees, 45 degrees or 90 degrees and the liquid crystal layer LCL is not provided, so that almost no stain occurs, and image quality is improved.

In the embodiment B-e, when the optical axis of the liquid crystal layer LCL is 0 degrees, 45 degrees or 90 degrees, a luminance deviation similar to that of the situation in which the liquid crystal layer LCL is not provided is shown. Therefore, when the optical axis is 0 degree, 45 degree or 90 degree, a stain occurs.

On the other hand, in the embodiment B-e, when the optical axis of the liquid crystal layer (LCL) is 25 degrees or 65 degrees, a luminance deviation is reduced compared to the situations in which the optical axis is 0 degrees, 45 degrees or 90 degrees and the liquid crystal layer LCL is not provided, so that an occurrence of a stain can be minimized and image quality is improved.

In addition, in the embodiment B-f, when the optical axis of the liquid crystal layer LCL is 0 degrees, 45 degrees or 90 degrees, a luminance deviation similar to that of the situation in which the liquid crystal layer LCL is not provided is shown. Therefore, when the optical axis is 0 degrees, 45 degrees or 90 degrees, a mura type image defect occurs.

On the other hand, in the embodiment B-f, when the optical axis of the liquid crystal layer LCL is 25 degrees or 65 degrees, a luminance deviation is further reduced compared to the situations in which the optical axis is 0 degrees, 45 degrees or 90 degrees and the liquid crystal layer (LCL) is not provided, so that a mura rarely occurs and image quality is improved.

As such, in the present disclosure, in the situation in which the first film TF having an optical axis direction of 0 degrees or 45 degrees and a retardation of 5000 nm or 10000 nm and the liquid crystal layer LCL having a retardation of $\lambda/4$ is provided, when the optical axis of the liquid crystal layer LCL is 15 degrees to 30 degrees and 60 degrees to 75 degrees, the luminance deviation is reduced, thereby minimizing an occurrence of a stain and improving image quality.

In addition, in this disclosure, in the situation in which the first film TF having an optical axis direction of 0 degrees or 45 degrees and a retardation of 5000 nm or 10000 nm and the liquid crystal layer LCL having a retardation of $\lambda/2$ is provided, when the optical of the liquid crystal layer (LCL) is 15degrees to 30 degrees and 60 degrees to 75 degrees, the luminance deviation is greatly reduced, thereby preventing an occurrence of a stain and improving image quality.

An effect of preventing a stain type image defect can be obtained in the same way when the optical axis of the liquid crystal layer LCL is 105 degrees to 120 degrees, 150 degrees to 165 degrees, 185 degrees to 200 degrees, 230 degrees to 245 degrees, 285 degrees to 300 degrees, and 330 degrees to 345 degrees.

Figure 6A:
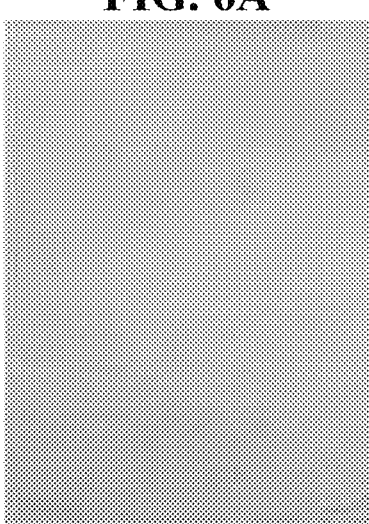
FIGS. 6A and 6B are views illustrating images displayed in a front viewing direction and in left and right and top and bottom viewing angle directions in a display apparatus without a liquid crystal layer.
Figure 6B:
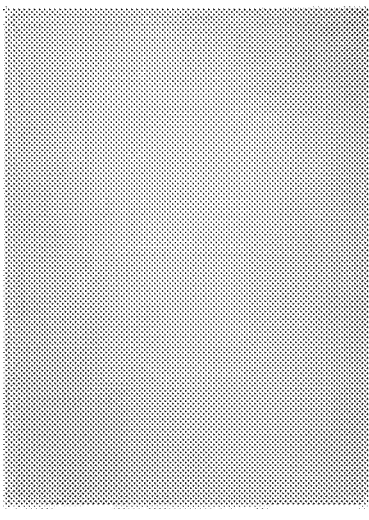
Figure 7A:
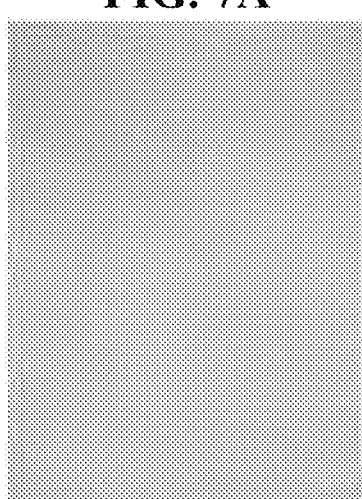
FIGS. 7A and 7B are views illustrating images displayed in a front viewing angle and in a predetermined viewing angle in a display apparatus with a liquid crystal layer according to an embodiment of the present disclosure.
Figure 7B:
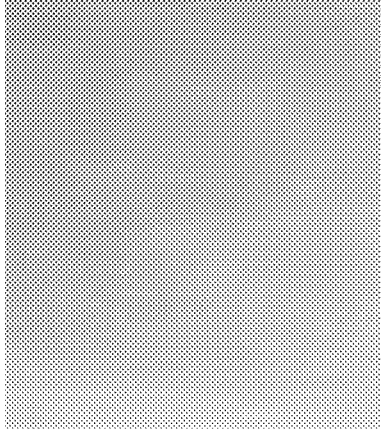

FIGS. 6A and 6B are views illustrating images displayed in a front viewing direction and in left and right and top and bottom viewing angle directions in a display apparatus without a liquid crystal layer. FIGS. 7A and 7B are views illustrating images displayed in a front viewing angle and in a predetermined viewing angle in a display apparatus with a liquid crystal layer.

As shown in FIGS. 6A and 6B, in the situation of the display apparatus without a liquid crystal layer, a stain such as a rainbow mura occurs in a lower region of an image in a front viewing direction, and a stain such as a rainbow mura occurs in a central region of an image in left and right and up and down viewing angle directions.

On the other hand, as shown in FIGS. 7A and 7B , in the situation of the display apparatus including the liquid crystal layer LCL, a stain image defect such as a rainbow mura does not occur at in a front viewing direction and in left and right and top and bottom viewing angle directions.

Therefore, in the display apparatus according to the first embodiment of the present disclosure, by forming the liquid crystal layer LCL between the second film TCF of high hardness and the first film TF, a stain such as a rainbow mura due to a birefringence characteristic of the first film TF and the second film TCF can be prevented.

Figure 8:
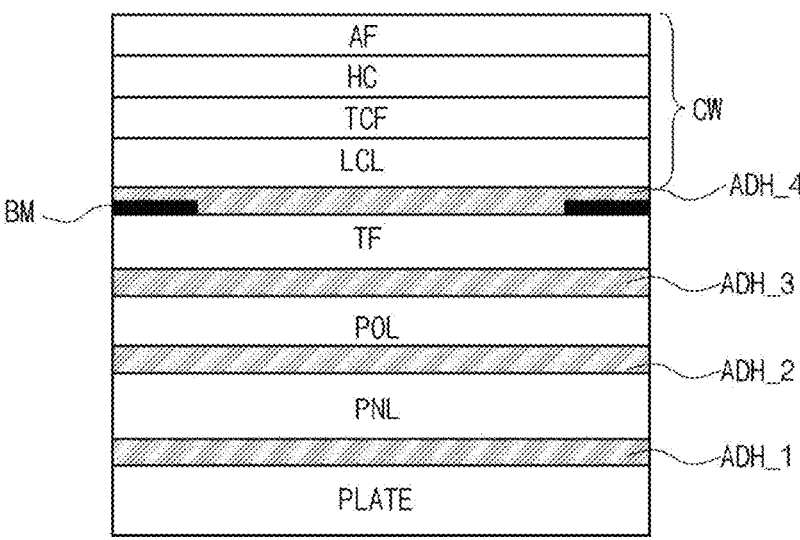
FIG. 8 is a view illustrating a display apparatus according to another embodiment of the present disclosure.

FIG. 8 is a view illustrating a display apparatus according to a second embodiment of the present disclosure. Explanations of the same structure as that of the first embodiment of FIG. 2 can be omitted or simplified, and other structure can be described in detail.

As shown in FIG. 8, the display apparatus DIS of this embodiment can include a back plate PLATE, a display panel PNL disposed on the back plate PLATE to display an actual image, a polarizing plate POL disposed on the display panel PNL to prevent reflection of external light incident from an outside, a first film TF disposed on the polarizing plate POL, and a cover member CW disposed on the first film TF.

The display panel PNL and the back plate PLATE can be attached by a first adhesive ADH_1, the polarizer POL and the display panel PNL can be attached by a second adhesive ADH_2, the first film TF can be attached to the polarizing plate POL by a third adhesive ADH_3, and the cover member CW can be attached to the first film TF by a fourth adhesive ADH_4.

The cover member CW can be disposed on the first film TF to protect the display panel PNL from an external impact or a foreign substance such as moisture. The cover member CW can include a liquid crystal layer LCL formed on the first film TF, a second film TCF disposed on the liquid crystal layer LCL, a coating layer HC disposed on the second film TCF, and a functional layer AF disposed on the coating layer HC.

The liquid crystal layer LCL can have a retardation of $\lambda/4$ to $\lambda/2$ and can be formed to a thickness of 4 μm or less. The second film TCF can be formed of a high hardness material. For example, the second film TCF can be formed of a material having a modulus of 100 MPa or more and less than 10 GPa and a Poisson's Ratio of 0.37 to 0.43.

The second film TCF can use a transparent polyimide film having no color, such as CPI, but is not limited thereto. For example, the second film TCF can be formed of a material having a modulus of 100 MPa or more and less than 10 GPa and a Poisson's ratio of 0.37 to 0.43. For example, the second film TCF can use PET, PEN, and/or acryl, but is not limited thereto. The second film TCF can be formed to a thickness of 50 μm to 120 μm (e.g., 85 μm). In addition, a front retardation (Ro) of the second film TCF can be set to 5000 nm to 10000 nm (e.g., 7500 nm) at a wavelength of 550 nm.

When an optical axis (phi) of the first film TF is 0 degrees or 45 degrees, an optical axis (phi) of the liquid crystal layer LCL (e.g., an alignment direction of liquid crystal molecules in the liquid crystal layer LCL) can be 15 degrees to 30 degrees, 60 degrees to 70 degrees, 105 degrees to 120 degrees, 150 degrees to 165 degrees, 185 degrees to 200 degrees, 230 degrees to 245 degrees, 285 degrees to 300 degrees, and 330 degrees to 345 degrees.

A black matrix BM can be formed on an edge of the first film TF to prevent light output from the display panel PNL from leaking to an edge of the display apparatus. The black matrix BM can be formed of a metal oxide such as CrOx, a black resin, or a black ink, but is not limited thereto. For example, a black matrix BM can be formed all along an outer perimeter and surround or enclose a central display area (e.g., similar to a frame type structure when viewed from above).

Even in the display apparatus of this embodiment, by forming the liquid crystal layer LCL between the second film TCF of high hardness and the first film TF, a stain such as a rainbow mura due to a birefringence characteristic of the first film TF and the second film TCF can be prevented.

Figure 9:
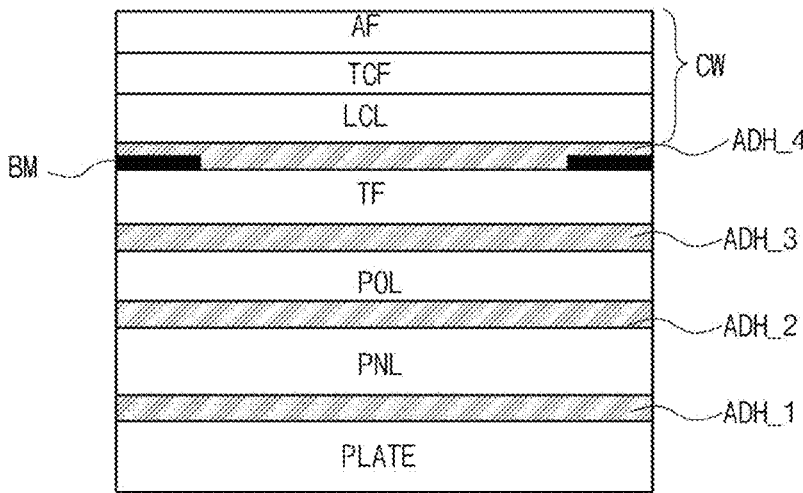
FIG. 9 is a view illustrating a display apparatus according to another embodiment of the present disclosure.

FIG. 9 is a view illustrating a display apparatus according to a third embodiment of the present disclosure. Explanations of the same structure as the first embodiment of FIG. 2 and the second embodiment of FIG. 8 can be omitted or simplified, and other structure can be described in detail.

The display apparatus of the third embodiment of the present disclosure can include a back plate PLATE, a display panel PNL disposed on the back plate PLATE to display an actual image, a polarizing plate POL disposed on the display panel PNL to prevent reflection of incident external light from an outside, a first film TF disposed on the polarizing plate POL, and a cover member CW disposed on the first film TF.

The display panel PNL can be attached to the back plate PLATE by a first adhesive ADH_1, the polarizing plate POL can be attached to the display panel PNL by a second adhesive ADH_2, the first film TF can be attached to the polarizing plate POL by a third adhesive ADH_3, and the cover member CW can be attached to the first film TF by a fourth adhesive ADH_4.

The cover member CW can be disposed on the first film TF to protect the display panel PNL from an external impact or a foreign substance such as moisture. The cover member CW can include a liquid crystal layer LCL formed on the first film TF, a second film TCF disposed on the liquid crystal layer LCL, and a functional layer AF disposed on the second film TCF.

In the first and second embodiments of the present disclosure, the coating layer HC is formed on the liquid crystal layer LCL, and the functional layer AF is formed on the coating layer HC. However, in this embodiment, the coating layer HC is not formed, and the functional layer AF can be formed on the liquid crystal layer LCL. For example, the functional layer AF can be directly formed on the liquid crystal layer LCL. Also, according to an embodiment, the functional layer AF and the liquid crystal layer LCL can directly contact opposite sides of the second film TCF.

The liquid crystal layer LCL can have a retardation of $\lambda/4$ to $\lambda/2$ and can be formed to a thickness of 4 μm or less (e.g., 2 μm). The second film TCF can be formed of a high hardness material. For example, the second film TCF can be formed of a material having a modulus of 100 MPa or more and less than 10 GPa and a Poisson's Ratio of 0.37 to 0.43.

The second film TCF can use a transparent polyimide film having no color, such as CPI, but is not limited thereto. For example, the second film TCF can be formed of a material having a modulus of 100 MPa or more and less than 10 GPa and a Poisson's ratio of 0.37 to 0.43. For example, the second film TCF can use PET, PEN, and/or acryl, but is not limited thereto. The second film TCF can be formed to a thickness of 50 μm to 120 μm (e.g., 85 μm). In addition, a front retardation (Ro) of the second film TCF can be set to 5000 nm to 10000 nm (e.g., 7500 nm) at a wavelength of 550 nm.

The functional layer AF according to this embodiment of the present disclosure can include at least one of an abrasion-resistant layer, an anti-contamination layer, a UV blocking layer, an anti-fingerprint layer, and an anti-glare layer, but is not limited thereto.

The abrasion-resistant layer and the anti-contamination layer can be formed of a material with good water repellency. For example, the abrasion-resistant layer and the anti-contamination layer can be formed of a material such as a hydrocarbon-based compound, a silicone-based compound, a chlorine compound, and/or a fluorine-based compound, but is not limited thereto.

The UV blocking layer can be formed of a resin containing a UV absorber and/or a light stabilizer. For example, the UV absorber can usually use 2-methylphenyl 4-methylbenzoate, but is not limited thereto. For example, the UV absorber can include a benzotriazol-based, a benzophenone-based, an oxalic acid anilide, and/or a cyaniacrylate-based material, but is limited thereto. In addition, the light stabilizer can use an amine based light stabilizer (e.g., hindered amine light stabilizer) of a Tinuvin 000 based material. For example, the light stabilizer can absorbs alkyl radicals and peroxide radicals generated by exposure to UV rays and stops a chain reaction, thereby blocking UV rays.

As the UV absorbers and/or light stabilizers are included, UV rays incident from the outside are blocked from being irradiated to the second film TCF, so that it is possible to prevent cracks from being generated due to the adhesives ADH_1 to ADH_4 of the display apparatus DIS being over-cured.

The anti-fingerprint layer can be formed using a method of increasing wetness of the second film TCF so that even if a fingerprint component is attached, the wetness is spread and not conspicuous. For example, the anti-fingerprint layer can be formed by laminating an organic material having water repellency and oil repellency. For example, the anti-fingerprint layer can be formed of a fluorine-based polymer or the like, but is not limited thereto.

The anti-glare layer can be formed by thinly coating a thin layer of SiOx on the second film TCF by a spray method, or by single or double surface treatment of the second film TCF, to generate a scattering effect, but is not limited thereto.

In the display apparatus DIS of this embodiment of the present disclosure, since the coating layer is not provided, a thickness of the cover member CW is reduced. Accordingly, compressive stress and elongational stress can be reduced when the display apparatus DIS is folded and unfolded, so that it is possible to prevent cracks from occurring in the cured liquid crystal layer LCL or adhesive ADH_1 to ADH_4 cured.

Figure 10:
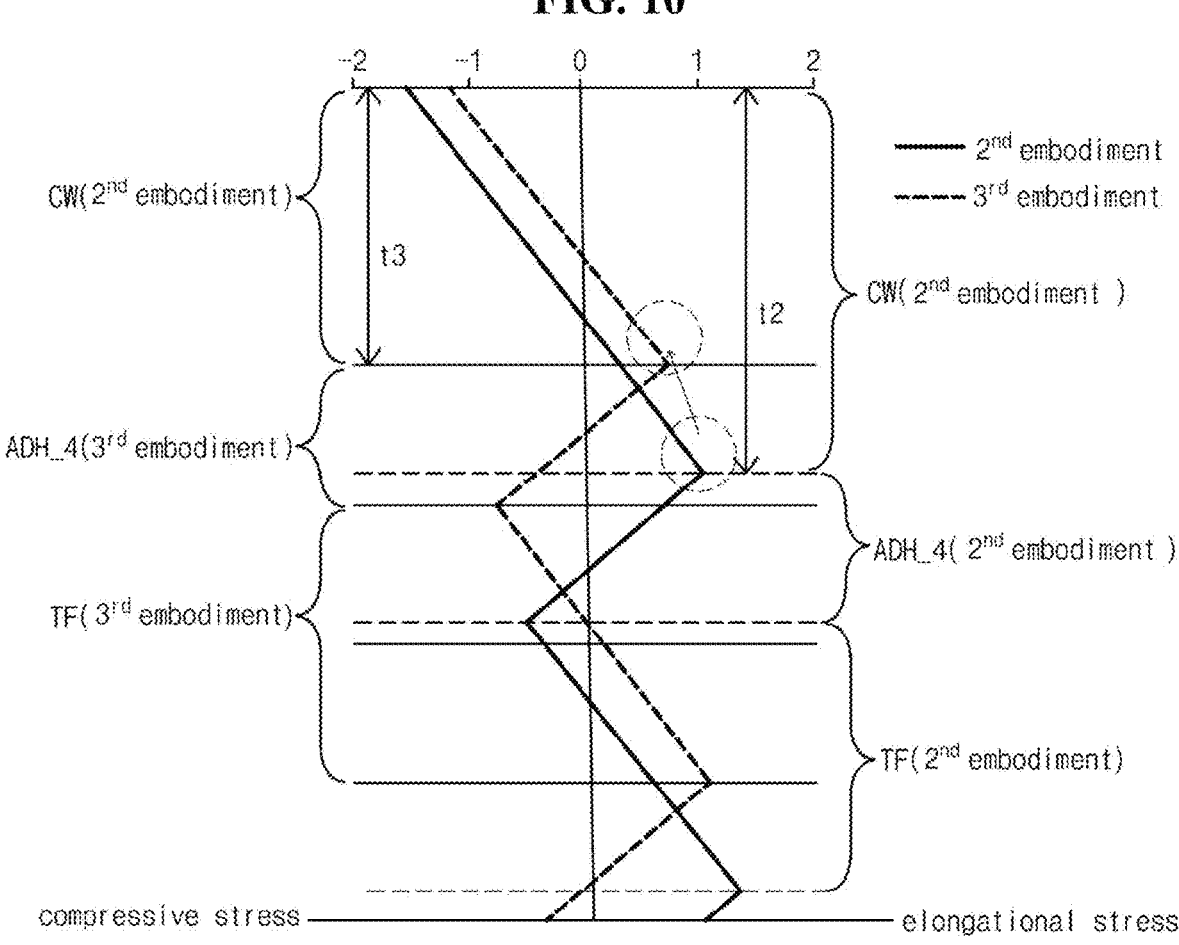
FIG. 10 is a view illustrating compressive stress and elongational stress applied to respective regions during in-folding in a display apparatus according to embodiments of the present disclosure.

FIG. 10 is a view illustrating compressive stress and elongational stress applied to respective regions during in-folding or bending in a display apparatus according to second and third embodiments of the present disclosure. In FIG. 10, in order to explain the stresses applied to the cover member CW, the stresses applied to the cover member CW and the first film TF therebelow are illustrated.

As shown in FIG. 10, when the display apparatus is in-folded, the greatest compressive stress is applied to a surface at an in-folded side, that is, a top surface of the cover member CW, and in a direction from the top surface to the bottom surface of the cover member CW, the compressive stress decreases and the elongational stress increases.

Since the fourth adhesive layer ADH_4 has elasticity, the compressive stress and elongational stress are reduced.

In addition, in the first film TF, by in-folding, the greatest pressure stress is applied to a top surface at an in-folded side, and in a direction from the top surface to the bottom surface of the first film TCF, a compressive stress decreases and a elongational stress increases.

The coating layer is formed in the display apparatus of the second embodiment, whereas the coating layer is not formed in the display apparatus of the third embodiment. Thus, the thickness t3 of the cover member CW of the display apparatus of the third embodiment is less than the thickness t2 of the cover member CW of the display apparatus of the second embodiment (e.g., t3<t2).

As shown in FIG. 10, in the third embodiment, as the thickness of the cover member CW decreases, the compressive stress applied to the top surface of the cover member CW is less than the compressive stress applied to the top surface of the cover member CW of the second embodiment. Accordingly, it is possible to prevent a defect such as a crack from occurring in an upper portion of the cover window CW, for example, in the functional layer AF due to the compressive stress.

In addition, when the elongational stress increases from the top surface to the bottom surface of the cover member CW, the thickness of the cover member CW in the second embodiment is relatively large. Thus, the elongational stress of the lower portion of the cover member CW of the third embodiment is less than the elongational stress of the lower portion of the cover member CW of the second embodiment.

Therefore, compared to the second embodiment, the elongational stress of the lower portion of the cover member CW in the third embodiment is reduced. Thus, it is possible to prevent cracks from occurring in the lower layer of the cover member CW, for example, the cured liquid crystal layer LCL.

Further, compared to the second embodiment, in the third embodiment, the compressive stress and the elongational stress can be reduced due to the decrease in thickness, so that the folding characteristic of the display apparatus can be improved.

In addition, even in the display apparatus of the third embodiment, by forming the liquid crystal layer LCL between the second film TCF of high hardness and the first film TF, a stain type image defect such as a rainbow mura due to a birefringence characteristic of the first film TF and the second film TCF can be prevented.

When the optical axis (phi) of the first film TF is 0 degrees or 45 degrees, the optical axis (phi) of the liquid crystal layer LCL is 15 degrees to 30 degrees, 60 degrees to 70 degrees, 105 degrees to 120 degrees, 150 degrees to 165 degrees, 185 degrees to 200 degrees, 230 degrees to 245 degrees, 285 degrees to 300 degrees, and 330 degrees to 345 degrees. The optical axis of the liquid crystal layer LCL can be an arrangement direction of liquid crystal molecules of the liquid crystal layer.

The black matrix BM can be formed on an edge of the first film TF to prevent light output from the display panel PNL from leaking to an edge of the display apparatus. For example, a black matrix BM can be formed all along an outer perimeter and surround or enclose a central display area. The present disclosure is not limited thereto, and the black matrix BM may not be formed on the first film TF.

Even in the display apparatus of the embodiment of the present disclosure, by forming the liquid crystal layer LCL between the second film TCF of high hardness and the first film TF, a stain such as a rainbow mura due to a birefringence characteristic of the first film TF and the second film TCF can be prevented.

The display apparatus according to the embodiments of the present disclosure can be described as follows.

The display apparatus according to the embodiments of the present disclosure includes a display panel displaying an image, a polarizing plate disposed on the display panel, a first film disposed on the polarizing plate; a liquid crystal layer disposed on the first film, and a second film disposed on the liquid crystal layer.

According to some embodiments of the present disclosure, the first film can be formed of at least one of polyethylene terephthalate (PET), triacetyl cellulose (TAC), and cycloolefin polymer (COP).

According to some embodiments of the present disclosure, the second film can have a front retardation of 5000 nm to 10000 nm (e.g., 7500 nm) at a wavelength of 550 nm.

According to some embodiments of the present disclosure, the second film can have a modulus of 100 MPa or more and less than 10 GPa, and has a Poisson's Ratio is 0.37 to 0.43.

According to some embodiments of the present disclosure, the second film can be formed of at least one of colorless polyimide (CPI), polyethylene terephthalate (PET), polyethylene naphthalate (PEN), and acryl.

According to some embodiments of the present disclosure, the thickness of the second film can be 50 μm to 120 μm (e.g., 85 μm).

According to some embodiments of the present disclosure, the liquid crystal layer can have a retardation of $\lambda/4$ to $\lambda/2$.

According to some embodiments of the present disclosure, a thickness of the liquid crystal layer can be 4 μm or less (e.g., 2 μm).

According to some embodiments of the present disclosure, when an optical axis of the first film is 0 degrees or 45 degrees, an optical axis of the liquid crystal layer can be 15 degrees to 30 degrees, 60 degrees to 75 degrees, 105 degrees to 120 degrees, 150 degrees to 165 degrees, 185 degrees to 200 degrees, 230 degrees to 245 degrees, 285 degrees to 300 degrees, and 330 degrees to 345 degrees.

According to some embodiments of the present disclosure, a coating layer disposed on the second film, and a functional layer disposed on the coating layer can be further included.

According to some embodiments of the present disclosure, the functional layer can include at least one of an anti-fingerprint layer, an anti-contamination layer, and an anti-glare layer.

According to some embodiments of the present disclosure, a functional layer disposed on the second film can be further included.

According to some embodiments of the present disclosure, the functional layer can include at least one of an abrasion-resistant layer, an anti-contamination layer, a UV blocking layer, an anti-fingerprint layer, and an anti-glare layer.

According to some embodiments of the present disclosure, a black matrix disposed along an edge of at least one surface of top and bottom surfaces of the first film can be further included.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A display apparatus, comprising:
   a display panel configured to display an image;
   a polarizing plate disposed on the display panel;
   a first film disposed on the polarizing plate;
   a second film disposed over the first film;
   a liquid crystal layer disposed between the first film and the second film, wherein the liquid crystal layer has a retardation of $\lambda/4$ to $\lambda/2$;
   a functional layer disposed on the second film, the functional layer including at least one of an anti-fingerprint layer, an anti-contamination layer, and an anti-glare layer; and
   a black matrix disposed in an edge area on the first film between the first film and the liquid crystal layer,
   wherein the liquid crystal layer is attached to the first film by at least one adhesive,
   wherein a lower surface of the black matrix contacts the first film, and an upper surface the black matrix is covered with the at least one adhesive,
   wherein the functional layer is in direct contact with an upper surface of the second film, and
   wherein the polarizing plate is disposed between the liquid crystal layer and the display panel, and the first film is disposed between the black matrix and the polarizing plate.

2. The display apparatus of claim 1, wherein the first film is formed of at least one of polyethylene terephthalate (PET), triacetyl cellulose (TAC), and cycloolefin polymer (COP).

3. The display apparatus of claim 1, wherein the second film has a front retardation of 5000 nm to 10000 nm at a wavelength of 550 nm.

4. The display apparatus of claim 3, wherein the second film has a modulus of 100 MPa to 10 GPa, and the second film has a Poisson's Ratio of 0.37 to 0.43.

5. The display apparatus of claim 4, wherein the second film is formed of at least one of colorless polyimide (CPI), polyethylene terephthalate (PET), polyethylene naphthalate (PEN), and acryl.

6. The display apparatus of claim 1, wherein a thickness of the second film is about 50 μm to 120 μm.

7. The display apparatus of claim 1, wherein a thickness of the liquid crystal layer is equal to or less than 4 μm.

8. The display apparatus of claim 1, wherein when an optical axis of the first film is 0 degrees or 45 degrees, an optical axis of the liquid crystal layer is 15 degrees to 30 degrees, 60 degrees to 75 degrees, 105 degrees to 120 degrees, 150 degrees to 165 degrees, 185 degrees to 200 degrees, 230 degrees to 245 degrees, 285 degrees to 300 degrees, and 330 degrees to 345 degrees.

9. The display apparatus of claim 1, wherein the first film is disposed between the liquid crystal layer and the display panel.

10. The display apparatus of claim 1, wherein the display panel is an organic light emitting diode (OLED) display panel.

11. The display apparatus of claim 1, wherein the display apparatus is a flexible display apparatus configured to in-fold or bend.

12. The display apparatus of claim 1, wherein the liquid crystal layer is configured to equalize light transmittance in an entire wavelength band to prevent a rainbow mura defect.

13. The display apparatus of claim 1, wherein the first film and the second film have birefringence.

14. The display apparatus of claim 1, wherein the functional layer includes a UV blocking layer.

\* \* \* \* \*